United States Patent
Hill et al.

(10) Patent No.: US 6,760,144 B2
(45) Date of Patent: Jul. 6, 2004

(54) ARTICULATED MEMS ELECTROSTATIC ROTARY ACTUATOR

(75) Inventors: Edward Hill, Chapel Hill, NC (US); Ramaswamy Mahadevan, Chapel Hill, NC (US); Vijayakumar Rudrappa Dhuler, Raleigh, NC (US); Robert Wood, Cary, NC (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 10/309,800

(22) Filed: Dec. 4, 2002

(65) Prior Publication Data

US 2004/0008400 A1 Jan. 15, 2004

Related U.S. Application Data

(60) Provisional application No. 60/336,812, filed on Dec. 5, 2001.

(51) Int. Cl.[7] .................. G02B 26/00; G02B 26/08; H02K 7/08; H02N 1/00; C23F 1/00
(52) U.S. Cl. .................. 359/290; 359/291; 359/295; 359/198; 310/90; 310/309; 216/2
(58) Field of Search .................. 359/290, 291, 359/295, 245, 198, 223; 310/90, 309, 36; 216/2, 24, 33; 257/415, 420

(56) References Cited

U.S. PATENT DOCUMENTS

| | | | |
|---|---|---|---|
| 5,808,780 A | 9/1998 | McDonald | 359/290 |
| 6,201,629 B1 | 3/2001 | McClelland et al. | 359/223 |
| 6,201,631 B1 | 3/2001 | Greywall | 359/245 |
| 6,329,738 B1 | 12/2001 | Hung et al. | 310/309 |
| 6,353,492 B2 | 3/2002 | McClelland et al. | 359/254 |
| 6,359,718 B1 * | 3/2002 | Lin et al. | 359/224 |
| 6,379,510 B1 | 4/2002 | Kane et al. | 204/192.34 |
| 6,480,320 B2 * | 11/2002 | Nasiri | 359/291 |
| 6,495,893 B2 * | 12/2002 | Lin et al. | 257/415 |
| 6,533,947 B2 * | 3/2003 | Nasiri et al. | 216/2 |
| 6,618,184 B2 * | 9/2003 | Jin et al. | 359/291 |
| 2001/0048265 A1 | 12/2001 | Miller et al. | 310/309 |

OTHER PUBLICATIONS

US 2003/0007236 A1, Jan. 9, 2003, 359/290.*
"Optical Mems Design for Telecommunications Applications" Aksyuk et al. Solid–State Sensor, Actuator and Microsystems Workshop Hilton Head Island, South Carolina, Jun. 2–6, 2002.

* cited by examiner

Primary Examiner—Loha Ben
(74) Attorney, Agent, or Firm—Allen, Dyer, Doppelt, Milbrath & Gilchrist, P.A.

(57) ABSTRACT

A micro-electro-mechanical device designed such that the actuating means are only mechanically coupled to the optical components. The device includes a substrate, a mirror supported above the substrate, and a rotatory actuator also supported above the substrate. The mirror and actuator are mechanically coupled via a torsional coupling hinge such that the mirror can be angled and/or tilted by electrostatically driving the rotatory actuator. Advantageously, the micro-mirrors and actuator are fabricated from the same layer during the micro-machining fabrication process. In one embodiment, the mirror is rotatable about a fixed rotation axis. In another embodiment, the mirror is freely rotatable.

37 Claims, 13 Drawing Sheets

ARTICULATED MEMS ELECTROSTATIC ROTARY ACTUATOR

CROSS-REFERENCE TO RELATED APPLICATIONS

This applications claims priority from U.S. Provisional Appl. No. 60/336,812 filed on Dec. 5, 2001.

MICROFICHE APPENDIX

Not Applicable

FIELD OF THE INVENTION

The present invention relates generally to optical communication systems and more particularly to electro-mechanical systems (MEMS) devices and methods of fabricating the same.

BACKGROUND OF THE INVENTION

Optical communication systems are increasingly being used to communicate data, voice, multimedia and/or other communications. Optical communication systems may employ optical fibers and/or free space optical communication paths. It will be understood by those having skill in the art that optical communication systems may use optical radiation in the visible, ultraviolet, infrared and/or other portions of the electromagnetic radiation spectrum.

Reflectors, such as mirrors, are widely used in optical communications systems. For example, optical cross-connect switches often include an array of reflectors to reflect optical energy from any switch input to any switch output. Similarly, many add-drop optical switches, wavelength blockers, and/or dynamic gain equalizers also use an array of reflectors such as mirrors to couple various optical paths.

It has been proposed to fabricate arrays of reflectors using micro-electro-mechanical system (MEMS) technology. As is well known to those having skill in the art, MEMS devices are potentially low cost devices, due to the use of micro-electronic fabrication techniques. New functionality also may be provided, because MEMS devices can be much smaller than conventional electro-mechanical devices.

Many of the fabrication processes for MEMS, called micromachining, are borrowed from the integrated circuit industry, where semiconductor devices are fabricated using a sequence of patterning, deposition, and etch steps (e.g., on silicon). Silicon micromachining has been utilized since the early 1960s. At its early stage, bulk silicon micromachining was employed in the majority of the research efforts by etching away the bulk of the silicon wafer. Bulk micromachining was first practiced using anisotropic wet chemical etches, such as potassium hydroxide, which preferentially etch faster in certain crystallographic planes of single-crystal silicon. In the early 1980s, surface micromachining using sacrificial etching gave rise to new types of microsensors and microactuators. Typically, surface micromachining has used a deposited layer of polysilicon as the structural micro-mechanical material, which is deposited over a sacrificial layer onto a substrate, which is typically silicon, such that when the sacrificial layer is removed, the polysilicon remains free standing. Recent advancements in reactive ion etching (RIE) technology have made practical, and in many ways preferential, the use of dry plasma etching to define micro-mechanical structures. Reactive ion etching techniques are independent of crystal orientation, and can create devices exceeding the functionality of surface micro-machined devices. The use of single-crystal materials, particularly silicon, can be beneficial for mechanical applications because of the lack of defects and grain boundaries, maintaining excellent structural properties even as the size of the device shrinks. Fabrication techniques involving the bonding of two separate single-crystal wafers also have been proposed, wherein one wafer serves as the substrate and another wafer forms the structural micro-mechanical material/layer.

For many reflective MEMs applications, it is desirable that the reflectors are electrostatically actuated. Electrostatic actuation provides effective analog positioning and tuning. Furthermore, electrostatic actuators are relatively easy to fabricate and provide high operational speeds due to their relatively small mass. This is in contrast to other actuators, such as piezoelectric actuators, which are typically much heavier. Electrostatic actuation of a structure is typically accomplished by applying a voltage between an electrode on the structure and an electrode separated from the structure. The resulting attractive electrostatic force between the electrodes enables actuation of the structure toward the separated electrode. This applied electrostatic force is opposed by a characteristic mechanical restoring force that is a function of the structure's geometric and materials properties. However, the electrostatic force is a nonlinear function of distance. As the structure moves toward the separated electrode, such that the electrodes' separation distance decreases, the electrostatic force between the electrodes typically increases superlinearly. In contrast, the mechanical restoring force of the structure typically is a linear function of distance. Accordingly, not all positions between the electrodes are stable. In particular, when the air-gap between electrodes reaches a minimum spacing characteristic of the structure, the structure position is unstable and causes uncontrollable travel of the structure through the remaining distance to the separated electrode. This instability condition is generally known as "pull-in", and can result in stiction (i.e., where the reflector is stuck to the electrode) and/or actuator deformation. This pull-in phenomenon typically reduces the actuation range of electrostatic MEMS devices.

An example of a reflector array, which can be fabricated from the above processes, is shown in FIG. 1. The micromechanical structure 10 includes an array of single axis mirrors 12 disposed about a common rotation axis 14, which is parallel to the array axis. This type of structure is commonly referred to as a piano MEMS array. Each mirror 12a is suspended above a substrate 20 with a torsional hinge 16a, which ideally is coaxial with the rotation axis 14, such that the mirror 12a is able to pivot about the rotation axis 14. Each end of the torsional hinge 16a is connected to a mechanical anchor 18a.

Referring to FIGS. 2a and 2b, the pivotal movement of each mirror 12a in FIG. 1 is electrostatically actuated by first 22 and second 24 lower electrodes deposited on the substrate 20, under the mirror 12a. In particular, a voltage applied between an upper electrode (i.e., the micro-mirror) and a first underlying electrode 22 will tilt the mirror in a first direction, while a voltage applied between the upper electrode and a second underlying electrode 24 will tilt the mirror in a second opposite direction, as shown by the dotted lines in FIG. 2b.

Unfortunately, the single-axis design illustrated in FIGS. 1 and 2a,b is associated with a number of disadvantages. In general, these disadvantages are related to the fact that the micro-mirrors (i.e., the optical components) are part of the actuators (i.e., the electromechanical components), and thus the optimization of each component is compromised. For example, in terms of optimizing the optical design it is often desired to have a micro-mirror size that is large enough to facilitate alignment and reduce insertion loss. In practice, the electromechanical requirements can limit the size of the optical components, since it is faster and requires less energy to move a lighter object. Similarly, using the piano MEMS shown in FIGS. 2a and 2b as an example, a longer arm provides a stronger electromechanical design due to increased leverage and/or torque and thus less actuation energy, whereas a shorter arm provides a stronger optical design, since it provides greater rotation angles and/or reduces the effect of pull-in. Unfortunately, these contrasting requirements can introduce challenges in the MEMS design.

U.S. Pat. No. 6,480,320 to Nasiri discloses a micro-electromechanical mirror and mirror array that addressed some of these concerns. However, in this micro-electromechanical device, the mirror is supported on a post above the actuation layer (i.e., there are two structural micro-mechanical layers, the upper mirror layer and the lower actuator layer). Accordingly, the device proposed by Nasiri is relatively complex to fabricate. Moreover, it is expected that the excess mass will lower the resonant frequency.

It is an object of the instant invention to provide a MEMS device wherein the electromechanical design is less integrated with the optical design.

It is another object of the instant invention to provide a MEMS device that is relatively easy to fabricate.

SUMMARY OF THE INVENTION

The instant invention provides a MEMS device wherein the actuators are only mechanically coupled to the optical components. For example, in one embodiment, the MEMS device includes an array of micromirrors, wherein the rotation of each micromirror is actuated by one or more electrostatically driven levers that are mechanically coupled to the micromirrors. Preferably, each micro-mirror and/or lever is suspended above the electromechanical substrate via one or more torsional hinges. Advantageously, the micro-mirrors and lever are fabricated from the same layer during the micro-machining process.

In accordance with the instant invention there is provided a micro-electro-mechanical device comprising: a substrate; a mirror supported above the substrate, the mirror including a first plate having a reflective coating deposited thereon and configured to tilt about a first rotation axis; and an actuator for controlling a tilt of the first plate, the actuator including a second other plate supported above the substrate, the second plate configured to tilt about a second other rotation axis, the first and second plates being mechanically coupled via a torsional coupling hinge.

In accordance with the instant invention there is provided a micro-electro-mechanical device comprising: a substrate; a linear array of mirrors suspended above the substrate, each mirror including a mirror plate with a reflective surface deposited thereon, each mirror plate movable about a fixed rotation axis; and an actuator for controlling the movement of each mirror, each actuator including a actuator plate suspended above the substrate, the actuator plate configured to move about another fixed rotation axis, wherein each mirror plate is mechanically coupled to an actuator plate via a torsional spring.

In accordance with the instant invention there is provided a micro-electro-mechanical device fabricated from a micro-machining process, the device comprising: a micro-electronic substrate; a mirror including a first plate having a reflective surface deposited thereon flexibly suspended over the micro-electronic substrate; and an actuator including a second plate flexibly suspended over the micro-electronic substrate and coupled to the first plate via a flexible joint, wherein the first plate, the flexible joint, and the second plate are fabricated from a same layer during the micro-machining process.

BRIEF DESCRIPTION OF THE DRAWINGS

Exemplary embodiments of the invention will now be described in conjunction with the following drawings wherein like numerals represent like elements, and wherein:

FIG. 2b is a side view of the micro-mirror shown in FIG. 2a;

FIG. 3b is a side view of the element illustrated in FIG. 3a;

FIG. 6b is a side view of the element illustrated in FIG. 6a;

FIG. 7b is a side view of the element illustrated in FIG. 7a;

FIG. 8b is a side view of the element illustrated in FIG. 8a;

FIG. 9b is a side view of the element illustrated in FIG. 9a;

DETAILED DESCRIPTION OF THE PREFERRED EMBODIMENTS

The instant invention provides an articulated MEMS electrostatic rotatary actuator. The articulated MEMS structure typically includes a first section having an optical function and a second section corresponding to an electrostatic actuator. Preferably, the first and second sections are connected with a flexible joint or joints that have torsional flexibility and are able to extend and/or stretch.

Figure 3A:
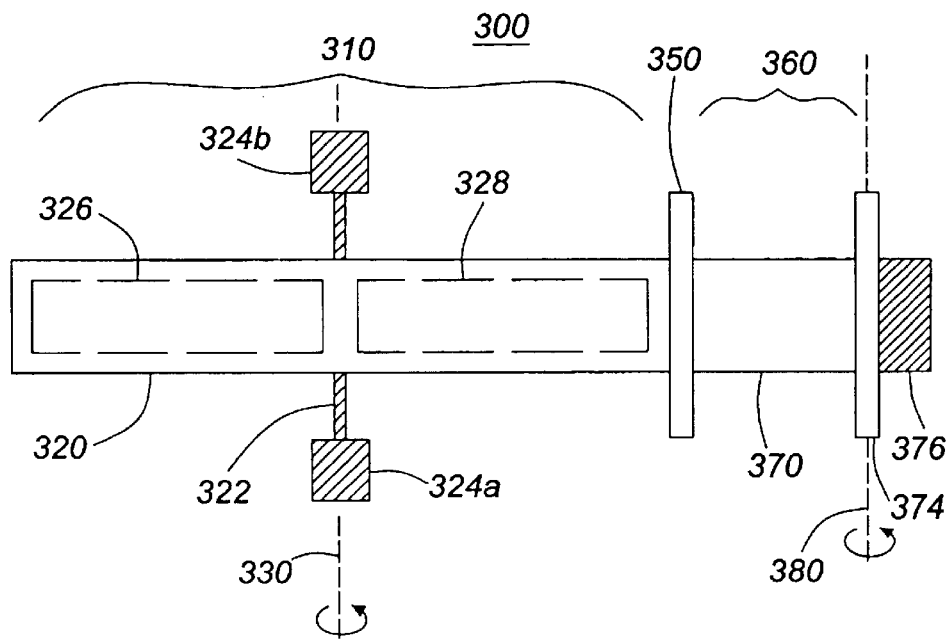
FIG. 3a is a schematic diagram of an element of a MEMS device in accordance with one embodiment of the instant invention, viewed from the top.

Referring to FIG. 3a, there is shown an articulated MEMS element for use in a reflective MEMS array in accordance with the instant invention. The element 300 includes an electrostatic rotatory actuator 310 and a micro-mirror 360 coupled together with a torsional coupling hinge 350.

Figure 3B:
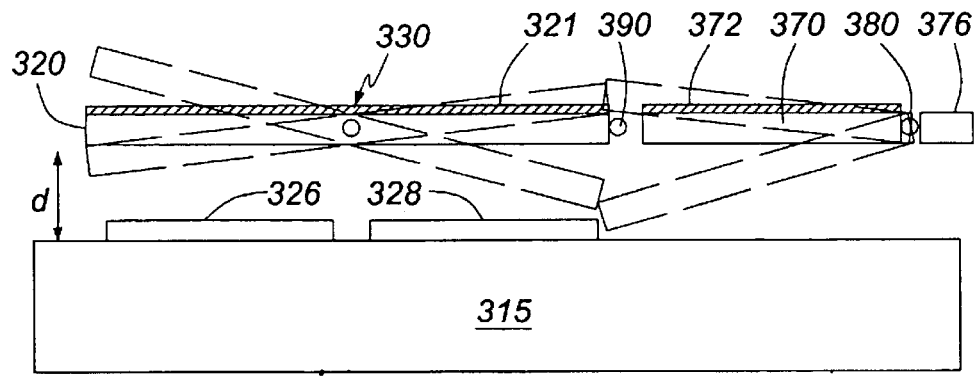

Referring also to FIG. 3b, the electrostatic actuator 310 includes a plate 320, a torsional hinge 322, mechanical anchors 324a, 324b, an upper electrode 321, and lower electrodes 326 and 328. The torsional hinge 322 has a first end coupled to a first side of the plate 320 and a second end coupled to a second opposing side of the plate 320. Each end of the torsional hinge 322 is supported by one of the mechanical anchors 324a, 324b, respectively, that are coupled to the substrate 315 such that the plate 320 is suspended above the substrate 315 and is able to tilt, rotate, and/or pivot about a rotation axis 330. In particular, the two flexible arms forming the hinge 322 are configured to twist about 330. Preferably, the actuator rotation axis 330 is approximately coaxial with the hinge axis. Movement of the plate 320 about the rotation axis 330 is actuated electrostatically. Specifically, a voltage is applied across the lower electrode 326 and the upper electrode 321 and/or across the lower electrode 328 and the upper electrode 321, to tilt the plate 320 towards one of two opposing sides as shown in FIG. 3b. For example, in one embodiment, the upper electrode is a continuous electrode deposited across the entire plate 320. In another embodiment, the upper electrode is deposited on the plate 320 in a predetermined pattern. Alternatively, since in many embodiments the plate will be conductive, a voltage is applied across the lower electrode 326 and the plate 320 and/or across the lower electrode 328 and the plate 320, to tilt the plate 320 towards one of two opposing sides as shown in FIG. 3b. In this latter instance, there the plate is the upper electrode and it is unnecessary for the plate 320 to having anything deposited thereon.

The mirror 360 includes a plate 370 having a reflective surface 372, a torsional hinge 374, and a mechanical anchor 376. The torsional hinge 374 has a first end coupled to the plate 370 and a second end coupled to the mechanical anchor 376, which is coupled to the substrate 315 such that the plate 370 is suspended above the substrate 315 and is able to tilt, rotate, and/or pivot about a rotation axis 380. Preferably, the mirror rotation axis 380 is approximately coaxial with the mirror hinge axis. Movement of the plate 370 about the rotation axis 380 is actuated via movement of the actuator plate 320. In particular, when a voltage is applied across the lower electrode 326 and the upper electrode 321 or plate 320 the mirror 370/372 pivots about its rotation axis 380 away from the substrate 315, whereas when a voltage is applied across the lower electrode 328 or plate and the upper electrode 321, the mirror 370/372 pivots about its rotation axis 380 towards the substrate 315. Essentially, the hinge 350 forms a torsional coupling axis 390 that travels with movement of the actuator and mirror.

Preferably, the plate 320, the torsional hinge 322, a portion of the mechanical anchors 324a, 324b, the torsional coupling hinge 350, the plate 370, the torsional mirror hinge 374, and a portion of the mirror anchor 376 are all fabricated from a same layer and/or material during the micromachining process (i.e., they are all one piece). The fabrication of the torsional hinge 322, the torsional coupling hinge 350, and the torsional mirror hinge 374 is similar to the fabrication of prior art torsional hinges, springs and/or couplers, which are known to those skilled in the art and are not discussed further. In particular, the torsional coupling hinge 350 is fabricated such that it provides torsional flexibility for allowing the rotation of the plate 320 and plate 370 relative to the other, and such that it provides extension between the plates as the coupling axis 390 moves.

Figure 1:
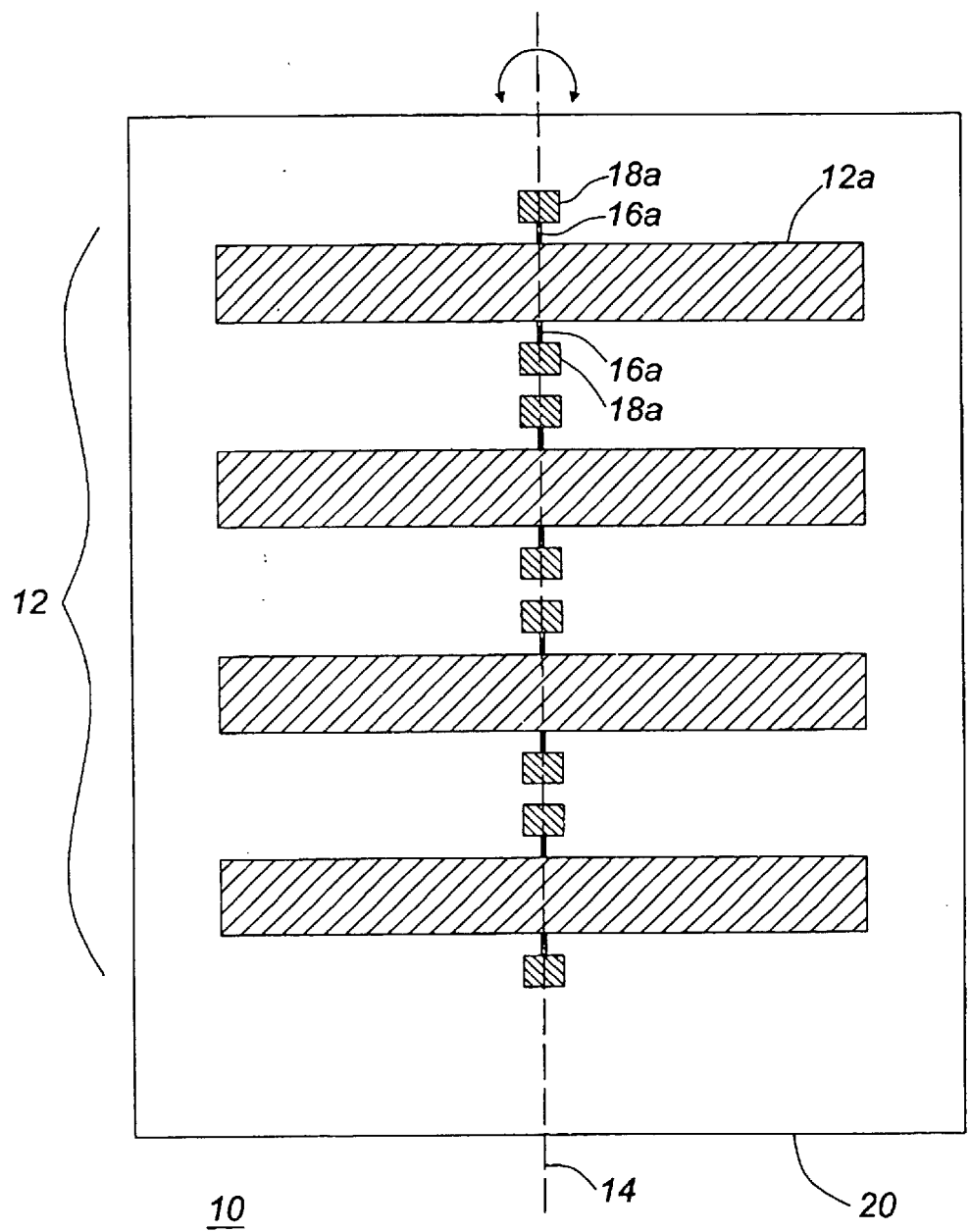
FIG. 1 is a schematic diagram of a prior art piano MEMS device.
Figure 2A:
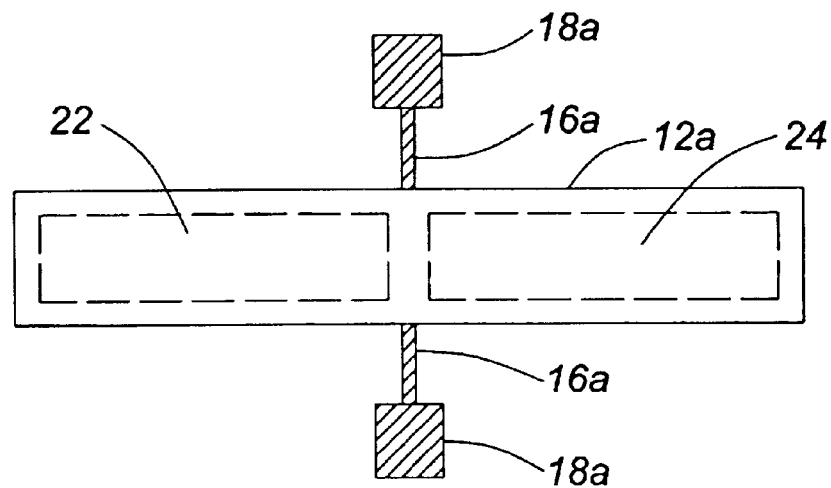
FIG. 2a is a top view of one micro-mirror of the device shown in FIG. 1.
Figure 2B:
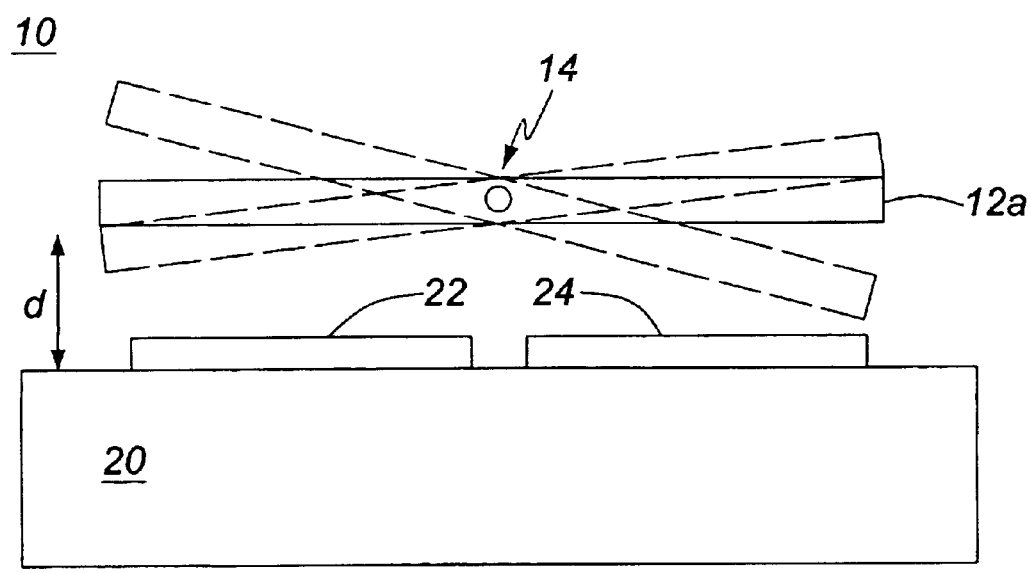

Notably, the articulated MEMS element shown in FIGS. 3a and 3b has a number of advantages over the simple design shown in FIGS. 2a and 2b. One advantage is greater design flexibility. For example, since the mirror 360 and the electrostatic actuator 310 are distinct (but connected) the actuator 310 is optionally designed with a different target controllable angle than the controllable angle of the mirror 360. For example, by designing each arm of the actuator plate 320 to be longer than the arm of the mirror plate 370, a large mirror tilt angle is achieved with only small actuator angles. Furthermore, the length of the mirror plate 370 can be selected to optimize the optical design, while the length of the actuator plate 320 is selected to optimize the mechanical design. Moreover, the articulated MEMS element provides an opportunity to increase the size of the electrodes 326, 328, which increases the torque. The stable angle and/or range of the mirror can be set by selecting the mechanical advantage between the actuator and the mirror.

The use of larger actuator moments leads to a second advantage of the element shown in FIGS. 3a and 3b, which is that the electrostatic actuation voltage required to move the mirror to a predetermined angle is reduced relative to the structure shown in FIGS. 2a and 2b. Advantageously, this also allows the electrostatic actuators to be driven below the highly nonlinear pull-in region of actuation, which provides greater linear control of the actuator. In other words, the articulated device is optionally designed to achieve the desired mirror angle without risking the actuator plate 320 nearing either of the lower electrodes 326 and 328.

Another advantage of the element shown in FIGS. 3a and 3b is that since the actuator plate 320 and mirror plate 370 are supported by a combination of flexible hinges, i.e., which also function like springs, the resonant frequency can be designed to be higher than the corresponding structure shown in FIGS. 2a and 2b, for a given voltage. The resonant frequency sets the scanning speed of the system. The resonant frequency is increased when a portion of the actuator plate 320 and/or upper electrode 321 is hollowed out or removed to reduce the mass of the plate. Notably, this cannot be done in the simple actuator embodiment shown in FIGS. 2a and 2b, since the electrodes also function as mirrors.

With respect to the above, the design of a micro-mirror is typically a compromise of trying to achieve maximum mirror deflection angles, higher resonant frequencies, and lower actuation voltages. In the articulated micro-mirror, in accordance with the instant invention, there is an additional degree of freedom in the design.

Figure 4:
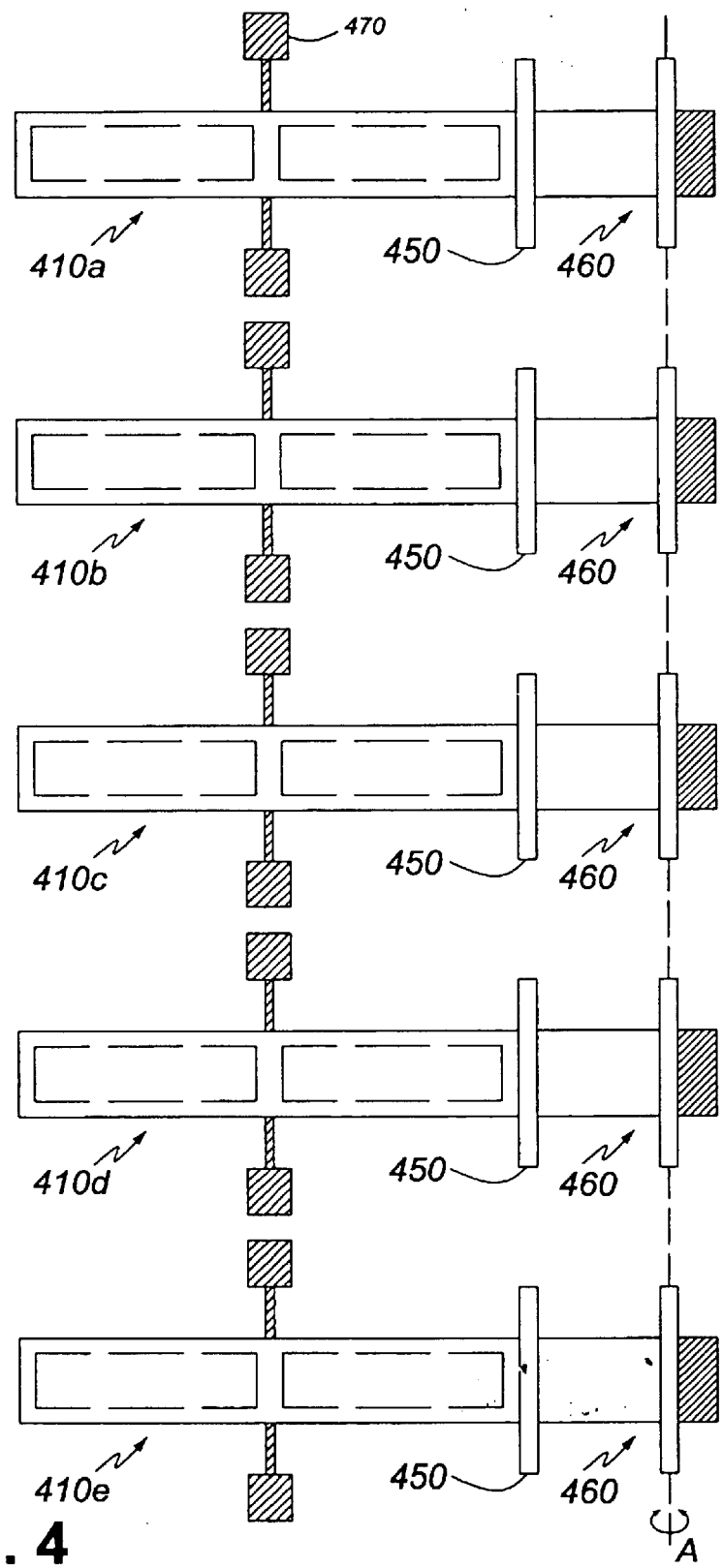
FIG. 4 is a schematic diagram of a reflective MEMS array according to one embodiment of the instant invention.

Referring to FIG. 4 there is shown a MEMS device in accordance with an embodiment of the instant invention including a plurality of the elements shown in FIGS. 3a and 3b. In particular, the MEMS device 400 includes a plurality of articulated MEMS elements that are identical to the articulated elements 300 shown in FIGS. 3a and 3b, above a common substrate (not shown). In particular, each articulated MEMS element includes an electrostatic rotatory actuator 410a, 410b, 410c, 410d, 410e, and a micro-mirror 460a, 460b, 460c, 460d, 460e, which are coupled together with a torsional coupling hinge 450a, 450b, 450c, 450d, 450e, respectively. In this embodiment, each electrostatic rotatory actuator is supported by separate mechanical anchors 470. However, it is also possible for the electrostatic rotatory actuator and/or mirrors to be supported by a shared mechanical anchor (not shown). The articulated elements are aligned above the substrate (not shown) such that their torsional mirror hinges are coaxial and they share a common mirror rotation axis A.

Figure 5:
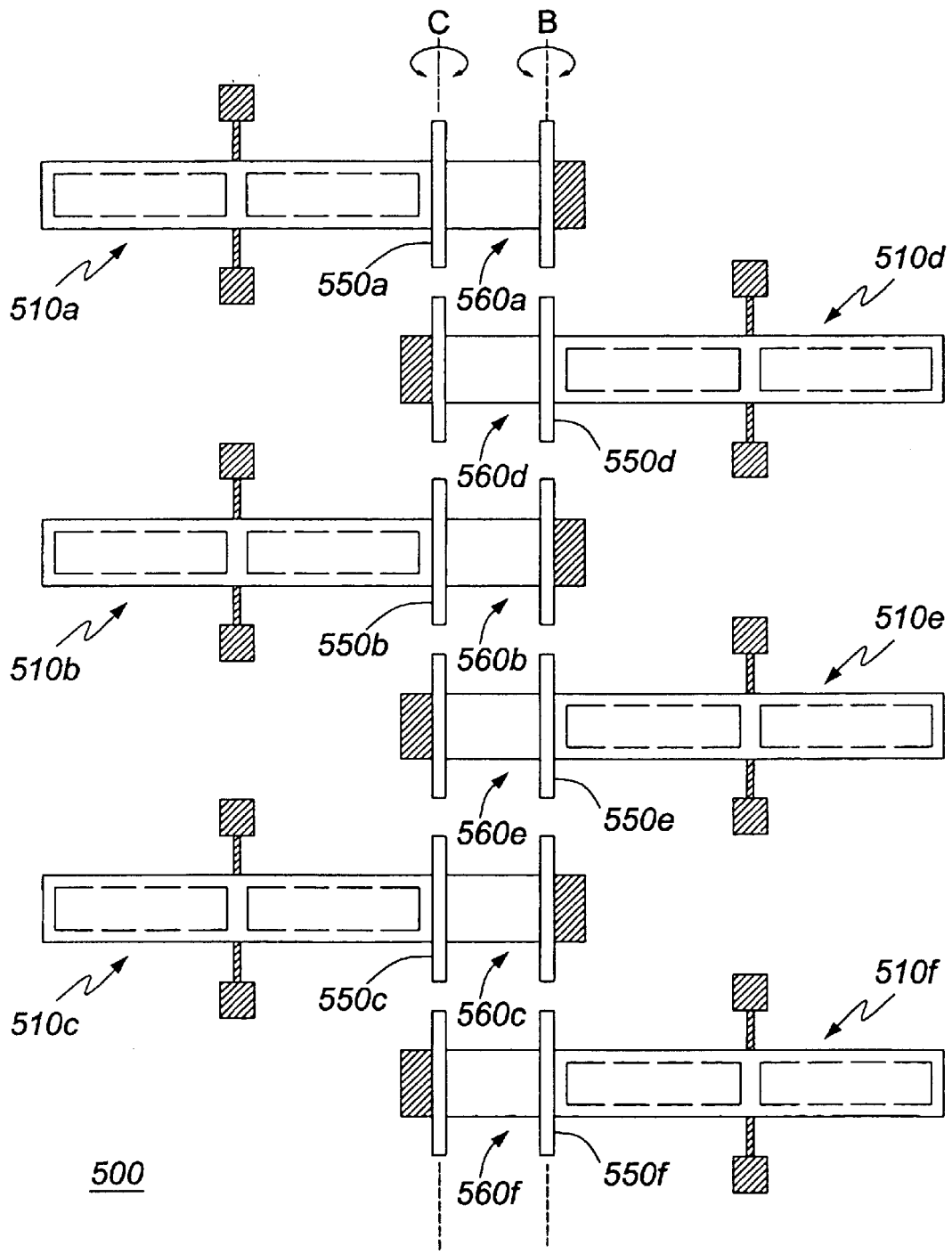
FIG. 5 is a schematic diagram of a reflective MEMS array according to another embodiment of the instant invention.

Referring to FIG. 5 there is shown a MEMS device in accordance with another embodiment of the instant invention. The MEMS device 500 includes a first plurality of articulated MEMS elements disposed on one side of the device, and a second plurality of articulated MEMS elements disposed on an opposing side of the device, all above a common substrate (not shown). Each element in the first and second plurality of elements is the same as the articulated element 300 shown in FIGS. 3a and 3b. In particular, each articulated MEMS element in the first plurality includes an electrostatic rotatory actuator 510a, 510b, 510c and a micro-mirror 560a, 560b, 560c, which are coupled together with a torsional coupling hinge 550a, 550b, 550c, respectively. Similarly, each articulated MEMS element in the second plurality includes an electrostatic rotatory actuator 510d, 510e, 510f and a micro-mirror 560d, 560e, 560f, which are coupled together with torsional coupling hinges 550d, 550e, 550f, respectively. The first plurality of articulated elements are aligned above the substrate (not shown) such that their torsional mirror hinges are coaxial and they share a common mirror rotation axis B, while the second plurality of articulated elements are aligned above the substrate (not shown) such that their torsional mirror hinges are coaxial and they share a common mirror rotation axis C. Rotational axes B and C are spatially separated.

Advantageously, the embodiment depicted in FIG. 5 provides a MEMS device with true actuator staggering. This is particularly advantageous when the micro-mirrors are end-mounted as illustrated in FIGS. 3a and 3b. In particular, since the position of the actuators along the array axis alternate sides about the rotational axes, there is greater flexibility regarding rotor hinge dimension and electrode width, in addition to an improved fill factor (i.e., the distance between adjacent mirrors is minimized). Accordingly, it is possible to have a larger number of micro-mirrors per given area. Advantageously, this embodiment also reduces electromechanical cross-talk between adjacent mirrors.

Figure 6A:
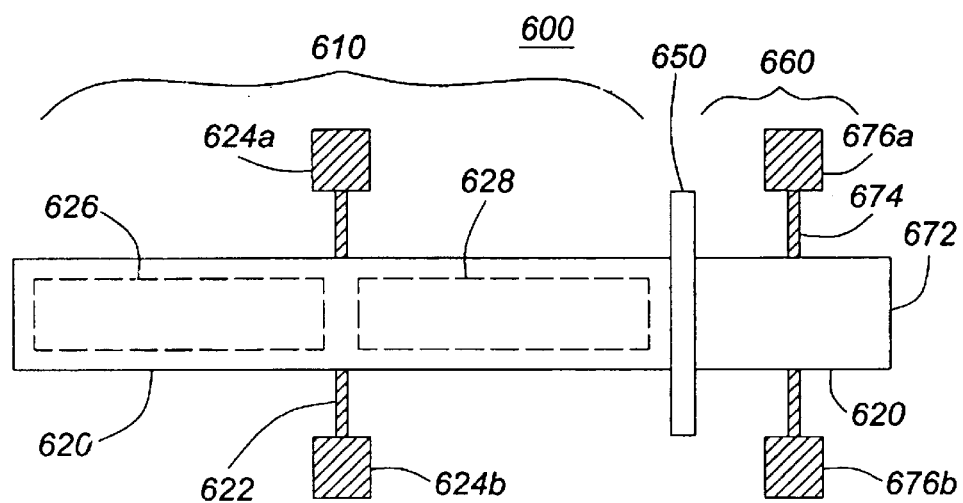
FIG. 6a is a schematic diagram of an element of a MEMS device in accordance with an embodiment of the instant invention, viewed from the top.
Figure 6B:
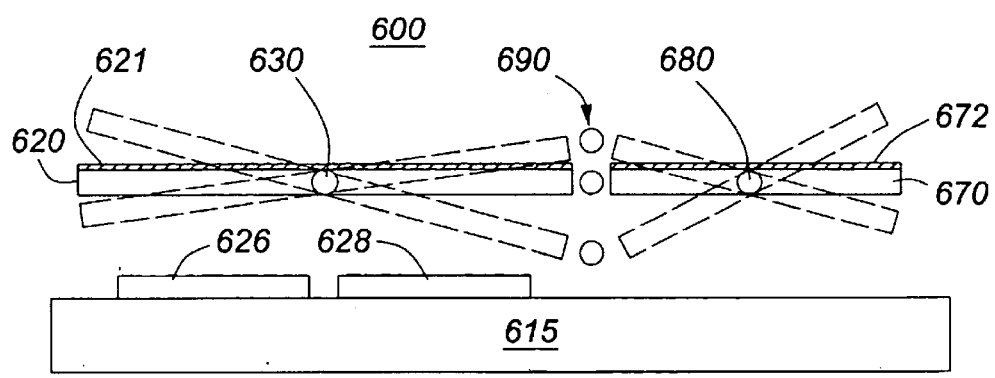

In the embodiment shown in FIGS. 3a and 3b the rotatory actuator was bi-directional and the mirror was end-mounted. Referring to FIGS. 6a and 6b there is shown another articulated MEMS element for use in a reflective MEMS array in accordance with another embodiment of the instant invention. The element 600 includes a bi-directional electrostatic rotatory actuator 610 and a centre-mounted micro-mirror 660, which are coupled together with a torsional coupling hinge 650.

The electrostatic actuator 610 includes a plate 620, a torsional hinge 622, mechanical anchors 624a, 624b, an upper electrode 621, and lower electrodes 626 and 628. The torsional hinge 622 has a first end coupled to a first side of the plate 620 and a second end coupled to a second opposing side of the plate 620. Each end of the torsional hinge 622 is supported by one of the mechanical anchors 624a, 624b, respectively, that are coupled to the substrate 615 such that the plate 620 is suspended above the substrate 615 and is able to tilt, rotate, and/or pivot about a rotation axis 630. Preferably, the actuator rotation axis 630 is approximately coaxial with the hinge axis. Movement of the plate 620 about the rotation axis 630 is actuated electrostatically. Specifically, a voltage is applied across the lower electrode 626 and the upper electrode 621 and/or across the lower electrode 628 and the upper electrode 621, to tilt the plate 620 towards one of two opposing sides as shown in FIG. 6b. In this embodiment, the upper electrode is a continuous electrode deposited across the entire plate 620. In another embodiment, the upper electrode is deposited on the plate 620 in a predetermined pattern. In yet another embodiment, the upper electrode is integral with the plate 620.

The mirror 660 includes a plate 670 having a reflective surface 672, a torsional hinge 674, and mechanical anchors 676a and 676b. The torsional hinge 674 has a first end coupled to a first side of the plate 670 and a second end coupled to a second opposing side of the plate 670. Each end of the torsional hinge 674 is supported by one of the mechanical anchors 676a, 676b, respectively, that are coupled to the substrate 615 such that the plate 670 is suspended above the substrate 615 and is able to tilt, rotate, and/or pivot about a rotation axis 680. Preferably, the mirror rotation axis 680 is approximately coaxial with the hinge axis. Movement of the plate 670 about the rotation axis 680 is actuated via movement of the actuator plate 620. In particular, when a voltage is applied across the lower electrode 626 and the upper electrode 621 the mirror 670/672 pivots about its rotation axis 680 in a clockwise direction, whereas when a voltage is applied across the lower electrode 628 and the upper electrode 621, the mirror 670/672 pivots about its rotation axis 680 in a counter-clockwise direction. The hinge 650 forms a torsional coupling axis 690 that travels with movement of the actuator and mirror.

Preferably, the plate 620, the torsional hinge 622, a portion of the mechanical anchors 624a, 624b, the torsional coupling hinge 650, the plate 670, the torsional mirror hinge 674, and a portion of the mirror anchors 676a and 676 are all fabricated from a same layer and/or material during the micromachining process (i.e., they are all one piece).

Figure 7A:
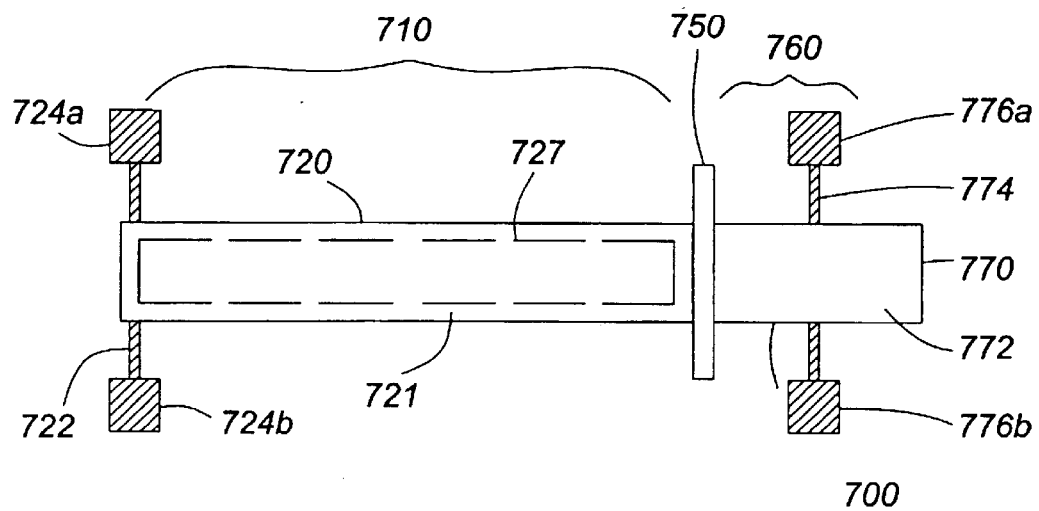
FIG. 7a is a schematic diagram of an element of a MEMS device in accordance with another embodiment of the instant invention, viewed from the top.
Figure 7B:
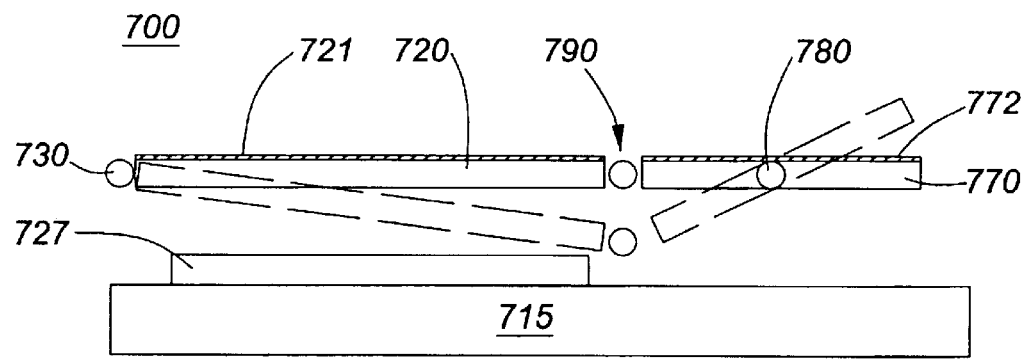

Referring to FIGS. 7a and 7b there is shown another articulated MEMS element for use in a reflective MEMS array in accordance with yet another embodiment of the instant invention. The element 700 includes a uni-directional electrostatic rotatory actuator 710 and a centre-mounted micro-mirror 760, which are coupled together with a torsional coupling hinge 750.

The electrostatic actuator 710 includes a plate 720, a torsional hinge 722, mechanical anchors 724a, 724b, an upper electrode 721, and a lower electrode 727. The torsional hinge 722 has a first end coupled to a first side of the plate 720 and a second end coupled to a second opposing side of the plate 720. Each end of the torsional hinge 722 is supported by one of the mechanical anchors 724a, 724b, respectively, that are coupled to the substrate 715 such that the plate 720 is suspended above the substrate 715 and is able to tilt, rotate, and/or pivot about a rotation axis 730. Preferably, the actuator rotation axis 730 is approximately coaxial with the hinge axis. Movement of the plate 720 about the rotation axis 730 is actuated electrostatically. Specifically, a voltage is applied across the lower electrode 727 and the upper electrode 721 the end of the plate coupled to the torsional coupling hinge 750 is tilted towards the substrate 715. In one embodiment, the upper electrode is a continuous electrode deposited across the entire plate 720. In another embodiment, the upper electrode is deposited on the plate 720 in a predetermined pattern. In yet another embodiment, the upper electrode is integral with the plate 720.

The mirror 760 includes a plate 770 having a reflective surface 772, a torsional hinge 774, and mechanical anchors 776a and 776b. The torsional hinge 774 has a first end coupled to a first side of the plate 770 and a second end coupled to a second opposing side of the plate 770. Each end of the torsional hinge 774 is supported by one of the mechanical anchors 776a, 776b, respectively, that are coupled to the substrate 715 such that the plate 770 is suspended above the substrate 715 and is able to tilt, rotate, and/or pivot about a rotation axis 780. Preferably, the actuator rotation axis 780 is approximately coaxial with the hinge axis. Movement of the plate 770 about the rotation axis 780 is actuated via movement of the actuator plate 720. In particular, when a voltage is applied across the lower electrode 727 and the upper electrode 721 the mirror 770/772 pivots about its rotation axis 780 in a counter-clockwise direction. When the applied voltage is removed the mirror 770/772 pivots about its rotation axis 780 in a clockwise direction. The hinge 750 forms a torsional coupling axis 790 that travels with movement of the actuator and mirror.

Preferably, the plate 720, the torsional hinge 722, a portion of the mechanical anchors 724a, 724b, the torsional coupling hinge 750, the plate 770, the torsional mirror hinge 774, and a portion of the mirror anchors 776a, 776b are all fabricated from a same layer and/or material during the micromachining process (i.e., they are all one piece).

Figure 8A:
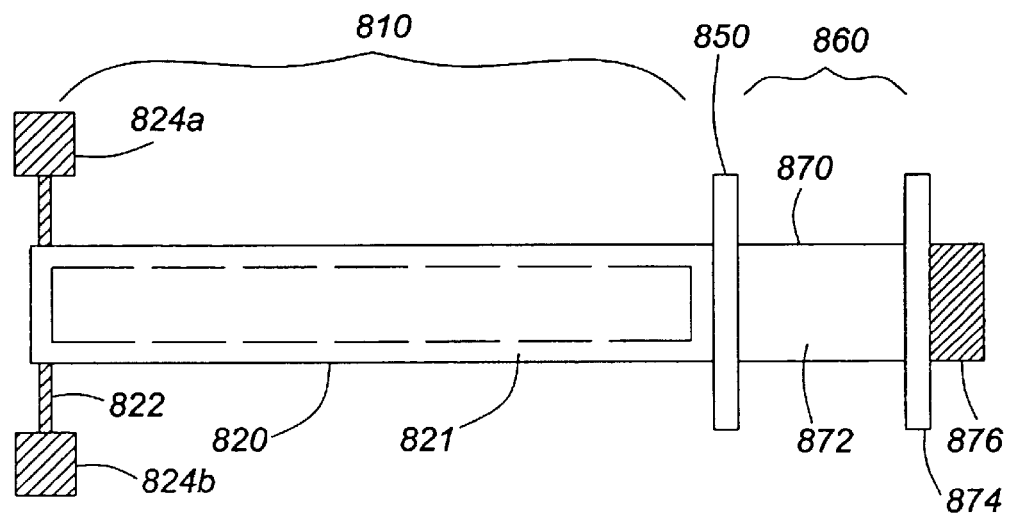
FIG. 8a is a schematic diagram of an element of a MEMS device in accordance with another embodiment of the instant invention, viewed from the top.
Figure 8B:
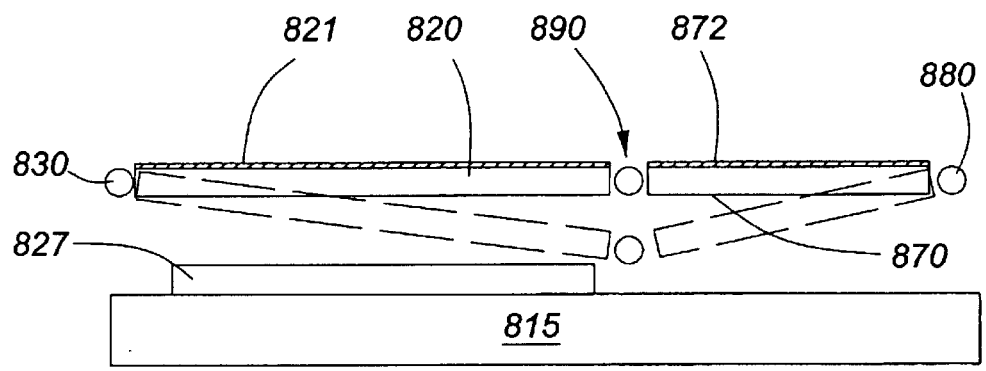

Referring to FIGS. 8a and 8b there is shown an articulated MEMS element for use in a reflective MEMS array in accordance with yet another embodiment of the instant invention. The element 800 includes a uni-directional electrostatic rotatory actuator 810 and an end-mounted mirror 860, which are coupled together with a torsional coupling hinge 850.

The electrostatic actuator 810 includes a plate 820, a torsional hinge 822, mechanical anchors 824a, 824b, an upper electrode 821, and a lower electrode 827. The torsional hinge 822 has a first end coupled to a first side of the plate 820 and a second end coupled to a second opposing side of the plate 820. Each end of the torsional hinge 822 is supported by one of the mechanical anchors 824a, 824b, respectively, that are coupled to the substrate 815 such that the plate 820 is suspended above the substrate 815 and is able to tilt, rotate, and/or pivot about a rotation axis 830. Preferably, the actuator rotation axis 830 is approximately coaxial with the hinge axis. Movement of the plate 820 about the rotation axis 830 is actuated electrostatically. Specifically, a voltage is applied across the lower electrode 827 and the upper electrode 821 the end of the plate coupled to the torsional coupling hinge 850 is tilted towards the substrate 815. In one embodiment, the upper electrode is a continuous electrode deposited across the entire plate 820. In another embodiment, the upper electrode is deposited on the plate 820 in a predetermined pattern. In yet another embodiment, the upper electrode is integral with the plate 820.

The mirror 860 includes a plate 870 having a reflective surface 872, a torsional hinge 874, and a mechanical anchor 876. The torsional hinge 874 has a first end coupled to the plate 870 and a second end coupled to the mechanical anchor 876, which is coupled to the substrate 815 such that the plate 870 is suspended above the substrate 815 and is able to tilt, rotate, and/or pivot about a rotation axis 880. Preferably, the mirror rotation axis 880 is approximately coaxial with the mirror hinge axis. Movement of the plate 870 about the rotation axis 880 is actuated via movement of the actuator plate 820. In particular, when a voltage is applied across the lower electrode 827 and the upper electrode 821 the mirror 870/872 pivots about its rotation axis 880 in a counter-clockwise direction. When the applied voltage is removed the mirror 870/872 pivots about its rotation axis 880 in a clockwise direction. The hinge 850 forms a torsional coupling axis 890 that travels with movement of the actuator and mirror.

Preferably, the plate 820, the torsional hinge 822, a portion of the mechanical anchors 824a, 824b, the torsional coupling hinge 850, the plate 870, the torsional mirror hinge 874, and a portion of the mirror anchor 876 are all fabricated from a same layer and/or material during the micromachining process (i.e., they are all one piece).

Figure 9A:
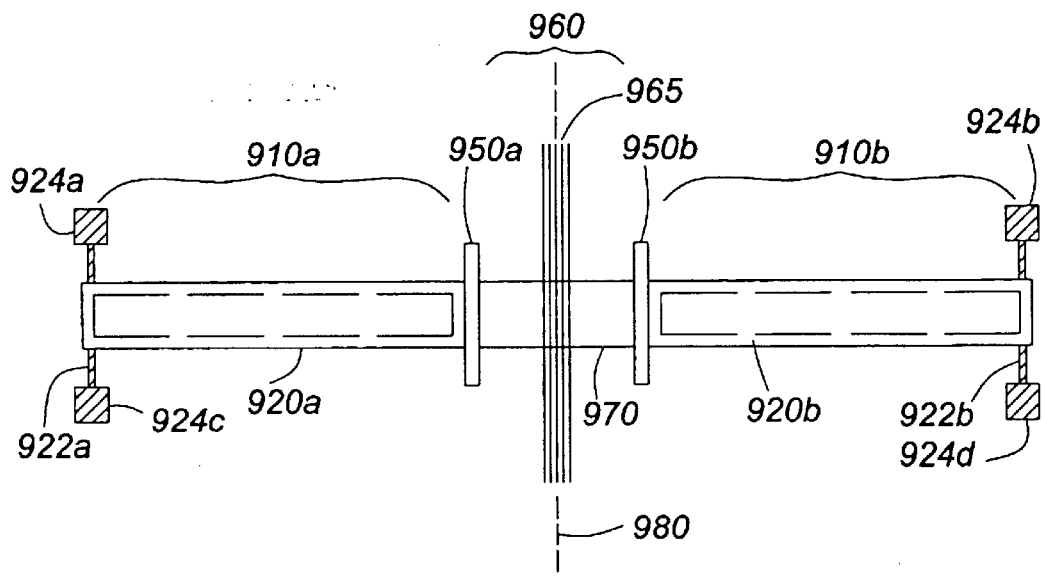
FIG. 9a is a schematic diagram of an element of a MEMS device in accordance with yet another embodiment of the instant invention, viewed from the top.
Figure 9B:
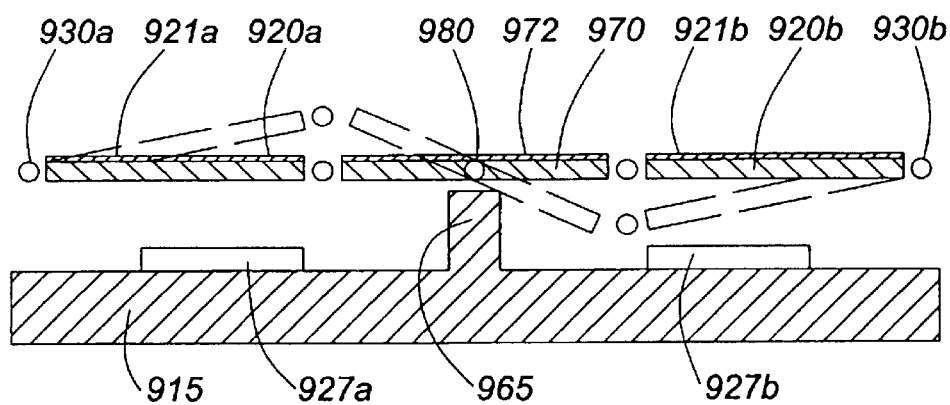

Referring to FIGS. 9a and 9b there is shown an articulated MEMS element for use in a reflective MEMS array in accordance with yet another embodiment of the instant invention. The element 900 includes two uni-directional electrostatic rotatory actuators 910a, 910b and a mirror 960 positioned over a fulcrum 965, wherein the electrostatic rotators 910a and 910b are coupled to the mirror 960 with torsional coupling hinges 950a and 950b, respectively.

The electrostatic actuator 910a includes a plate 920a, a torsional hinge 922a, mechanical anchors 924a, 924c, an upper electrode 921a, and a lower electrode 927a. The torsional hinge 922a has a first end coupled to a first side of the plate 920a and a second end coupled to a second opposing side of the plate 920a. Each end of the torsional hinge 922a is supported by one of the mechanical anchors 924a, 924c, respectively, that are coupled to the substrate 915 such that the plate 920a is suspended above the substrate 915 and is able to tilt, rotate, and/or pivot about a rotation axis 930a. Preferably, the actuator rotation axis 930a is approximately coaxial with the hinge axis. Movement of the plate 920a about the rotation axis 930a is actuated electrostatically. Specifically, a voltage is applied across the lower electrode 927a and the upper electrode 921a the end of the plate coupled to the torsional coupling hinge 950a is tilted towards the substrate 915. In one embodiment, the upper electrode is a continuous electrode deposited across the entire plate 920a. In another embodiment, the upper electrode is deposited on the plate 920a in a predetermined pattern. In yet another embodiment, the upper electrode is integral with the plate 920a.

The electrostatic actuator 910b includes a plate 920b, a torsional hinge 922b, mechanical anchors 924b, 924d, an upper electrode 921b, and a lower electrode 927b. The torsional hinge 922b has a first end coupled to a first side of the plate 920b and a second end coupled to a second opposing side of the plate 920b. Each end of the torsional hinge 922b is supported by one of the mechanical anchors 924b, 924d, respectively, that are coupled to the substrate 915 such that the plate 920b is suspended above the substrate 915 and is able to tilt, rotate, and/or pivot about a rotation axis 930b. Preferably, the actuator rotation axis 930b is approximately coaxial with the hinge axis. Movement of the plate 920b about the rotation axis 930b is actuated electrostatically. Specifically, a voltage is applied across the lower electrode 927b and the upper electrode 921b the end of the plate coupled to the torsional coupling hinge 950b is tilted towards the substrate 915. In one embodiment, the upper electrode is a continuous electrode deposited across the entire plate 920b. In another embodiment, the upper electrode is deposited on the plate 920b in a predetermined pattern. In yet another embodiment, the upper electrode is integral with the plate 920b.

The mirror 960 includes a plate 970 having a reflective surface 972. The mirror is suspended over the substrate 915 above a fulcrum 965 via torsional hinges 950a and 950b. The fulcrum 965 is a ridge between the plate 970 that extends across the width of the plate and serves as a point/axis on which the plate 970 rotates (i.e., forms the mirror rotation axis). Preferably, the fulcrum is coupled to the substrate 915 and has a square, rectangular, and/or irregular shape. Further optionally, the fulcrum is designed to function as a mechanical stop for the mirror. Movement of the plate 970 about the rotation axis 980 is actuated via movement of the actuator plates 920a, 920b. In particular, when a voltage is applied across the lower electrode 927a and the upper electrode 921a the mirror 970/972 pivots about its rotation axis 980 in a counter-clockwise direction. When a voltage is applied across the lower electrode 927b and the upper electrode 921b, the mirror 970/972 pivots about its rotation axis 980 in a clockwise direction. The hinges 950a, 950b form torsional coupling axes 990a, 990b that travel with movement of the actuators and mirror.

Preferably, the plate 920a, the torsional hinge 922a, a portion of the mechanical anchors 924a, 924c, the torsional coupling hinge 950a, the plate 970, the torsional coupling hinge 950b, a portion of the plate 920b, the torsional hinge 922b, and a portion of the mechanical anchors 924b, 924d are all fabricated from a same layer and/or material during the micromachining process (i.e., they are all one piece).

Figure 9C:
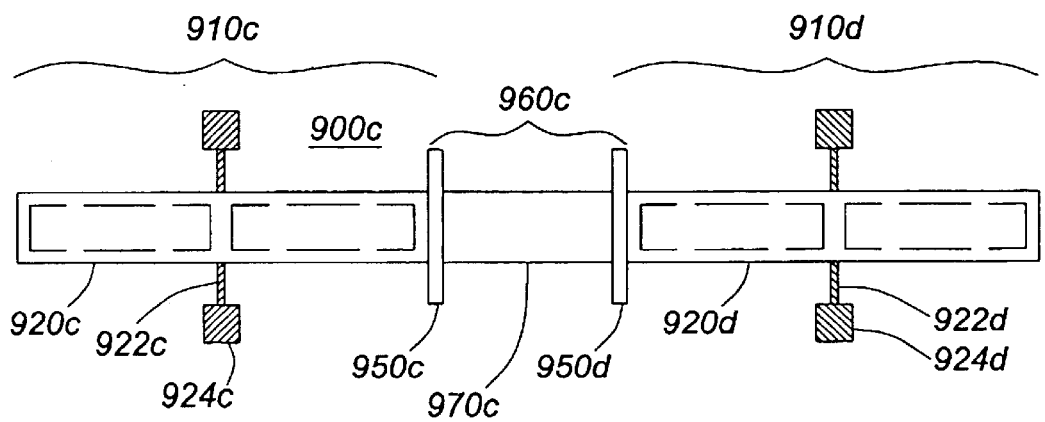
FIG. 9c is a schematic diagram of an element of a MEMS device in accordance with yet another embodiment of the instant invention, viewed from the top.
Figure 9D:
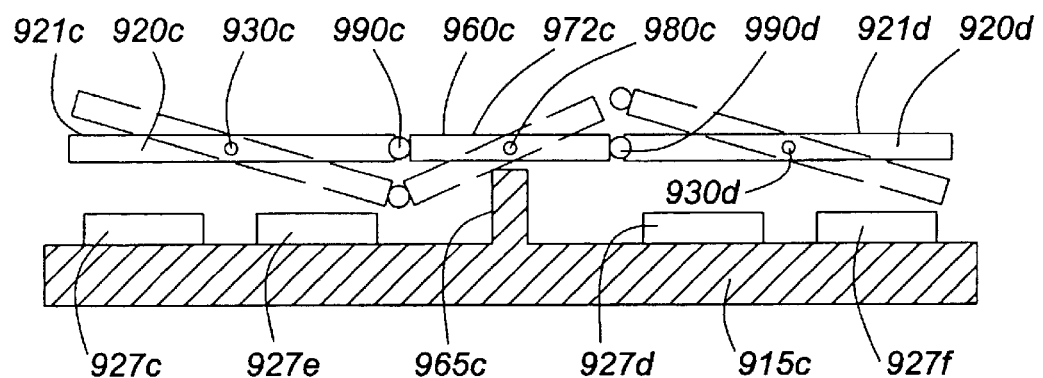
FIG. 9d is a side view of the element illustrated in FIG. 9c.

Referring to FIGS. 9c and 9d there is shown an articulated MEMS element for use in a reflective MEMS array in accordance with yet another embodiment of the instant invention. The element 900c is similar to the element 900 in FIGS. 9a and 9b, but includes two bi-directional electrostatic rotatory actuators 910c, 910d and a mirror 960c positioned over a fulcrum 965c, wherein the electrostatic rotators 910c and 910d are coupled to the mirror 960c with torsional coupling hinges 950c and 950d, respectively.

The electrostatic actuator 910c includes a plate 920c, a torsional hinge 922c, mechanical anchors 924c, an upper electrode 921c, and a lower electrodes 927c,e. The torsional hinge 922c has a first end coupled to a first side of the plate 920c and a second end coupled to a second opposing side of the plate 920c. Each end of the torsional hinge 922c is supported by one of the mechanical anchors 924c, that are coupled to the substrate 915c such that the plate 920c is suspended above the substrate 915c and is able to tilt, rotate, and/or pivot about a rotation axis 930c. Preferably, the actuator rotation axis 930c is approximately coaxial with the hinge axis. Movement of the plate 920c about the rotation axis 930c is actuated electrostatically. The electrostatic actuator 910d includes a plate 920d, a torsional hinge 922d, mechanical anchors 924d, an upper electrode 921d, and a lower electrodes 927d,f. The torsional hinge 922d has a first end coupled to a first side of the plate 920d and a second end coupled to a second opposing side of the plate 920d. Each end of the torsional hinge 922d is supported by one of the mechanical anchors 924d, that are coupled to the substrate 915c such that the plate 920d is suspended above the substrate 915c and is able to tilt, rotate, and/or pivot about a rotation axis 930d. Preferably, the actuator rotation axis 930d is approximately coaxial with the hinge axis. Movement of the plate 920d about the rotation axis 930d is actuated electrostatically.

The mirror 960c includes a plate 970c having a reflective surface 972c. The mirror is suspended over the substrate 915c above a fulcrum 965c via torsional hinges 950c and 950d. The fulcrum 965c is a ridge beneath the plate 970c that extends across the width of the plate and serves as a point/axis on which the plate 970c rotates (i.e., forms the mirror rotation axis). Preferably, the fulcrum is coupled to the substrate 915c and has a square, rectangular, and/or irregular shape. Further optionally, the fulcrum is designed to function as a mechanical stop for the mirror. Movement of the plate 970c about the rotation axis 980c is elestrostatically actuated via movement of the actuator plates 920c, 920d. The hinges 950c, 950d form torsional coupling axes 990c, 990d that travel with movement of the actuators and mirror.

Preferably, the plate 920c, the torsional hinge 922c, a portion of the mechanical anchors 924c, the torsional coupling hinge 950c, the plate 970c, the torsional coupling hinge 950d, a portion of the plate 920d, the torsional hinge 922d, and a portion of the mechanical anchors 924d are all fabricated from a same layer and/or material during the micromachining process (i.e., they are all part of one layer).

Notably, the articulated MEMS elements shown in FIGS. 6a,b, 7a,b, 8a,b, and 9a,b,c,d provide numerous advantages over prior art elements, as for example, those discussed above with respect to the embodiment shown in FIGS. 3a,b. In particular, these articulated MEMS elements provide greater flexibility and have a greater mechanical advantage, a lower actuation voltage, and can be designed with higher resonant frequencies than the embodiment shown in FIGS. 2a,b. Furthermore, it has also been shown that the articulated MEMS element can also provide an improved array fill factor. Moreover, fabricating the mirror plate, mirror hinges, actuator plate, and actuator hinges from the same layer simplifies the manufacturing process.

Each of the elements shown in FIGS. 6a,b, 7a,b, 8a,b, and 9a,b,c,d is suitable for use in the MEMS arrays depicted in FIGS. 4 and 5. Accordingly, the articulated MEMS devices can be used in various tilting mirror applications, such as wavelength switching and/or wavelength blocking.

Although the instant invention has been described heretofore with respect to Piano MEMS having a rectangular reflective surface, other types and configurations are also within the scope of the instant invention. For instance, the instant invention is also applicable to MEMS devices having square, circular, or oval shaped optics and/or having rotation axes that are perpendicular or at a 45 degree angle to the array axis. Furthermore, each MEMS element is optionally designed with an optical function other than reflectivity. It is also within the scope of the instant invention for the actuators to be actuated by actuation means other than electrostatic, including but not limited to electromagnetic, piezoelectric, and thermal actuation.

Figure 10A:
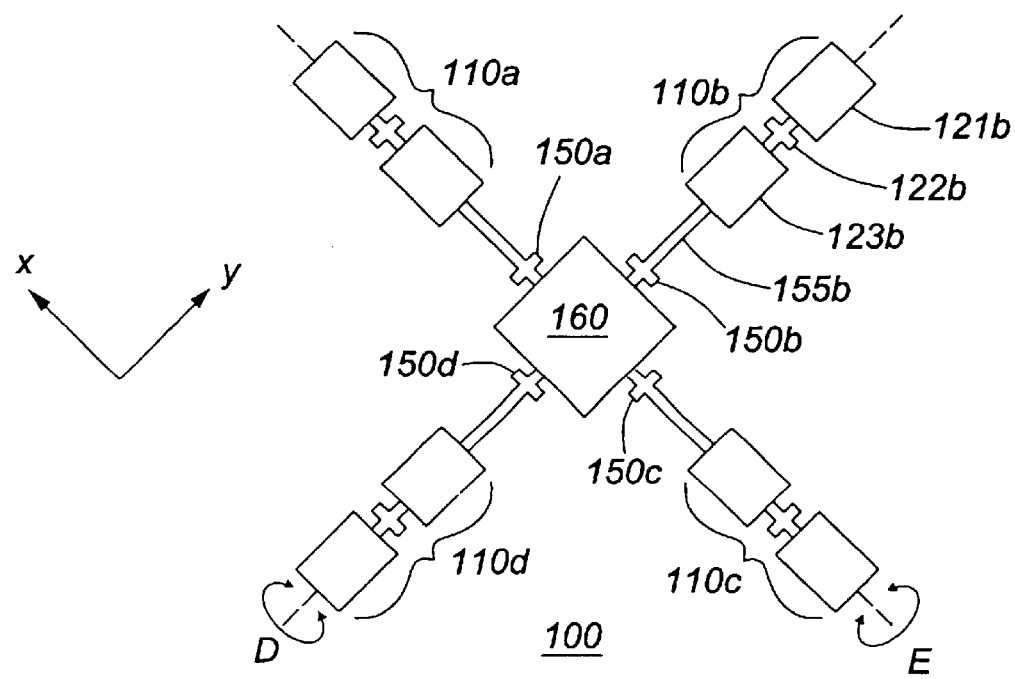
FIG. 10a is a schematic diagram of a 2D element of a MEMS device in accordance with an embodiment of the instant invention.

Referring to FIG. 10a there is shown an embodiment of an articulated reflective MEMS element having a two-axis design. The element 100 includes four bi-directional electrostatic rotatory actuators 110a, 110b, 110c, and 110d and a central mirror 160. Using electrostatic rotatory actuator 110b as an example, each electrostatic actuator includes a plate 121b/123b coupled to a torsional hinge 122b. Similar to the embodiments shown heretofore, each torsional hinge (e.g., 122b) is supported by mechanical anchors (not shown). The torsional hinges associated with electrostatic actuators 110a and 110c allow rotation about axes parallel to the y-axis, while torsional hinges associated with electrostatic actuators 110b and 110c allow rotation about axes parallel to the x-axis. Each plate of each electrostatic actuator 110a–d is associated with an upper electrode and two lower electrodes (not shown).

Each electrostatic actuator 110a–d is mechanically coupled to the central mirror 160 via a torsional coupling spring 150a–d and a coupling bar 155a–d, respectively. Preferably, each coupling bar is a rigid rod or beam fabricated at least in part from the same layer used to fabricate part of the mirror 160. Preferably, each torsional coupling spring allows rotation thereabout in axes parallel to both the x and y axes, and also provides flexure by extension (i.e., each torsional coupling spring is a universal coupler).

Electrostatic actuation of the embodiment shown in FIG. 10a is as follows. When a voltage is applied between the upper and lower electrodes of the outer portion of electrostatic actuator 110a and between the upper and lower electrodes of the inner portion of electrostatic actuator 110c, then the mirror rotates about the rotation axis D. In particular, when the voltage is applied between the upper and lower electrodes of the outer portion of the electrostatic actuator 110a, then the end of the mirror 160 coupled to the electrostatic actuator 110a is lifted up. Similarly, when the voltage is applied between the upper and lower electrodes of the inner portion of the electrostatic actuator 110c, then the end of the mirror 160 coupled thereto is drawn down towards the substrate (not shown). The torsional springs 150b and 150d function as a torsional hinge being co-axial with rotation axis D and parallel to the y-axis.

In contrast, when a voltage is applied between the upper and lower electrodes of the outer portion of the electrostatic actuator 110b and voltage is applied between the upper and lower electrodes of the inner portion of the electrostatic actuator 110d, then the end of the mirror 160 coupled to the electrostatic actuator 110b is lifted up and then the end of the mirror 160 coupled to the electrostatic actuator 110d is drawn down towards the substrate (not shown). In this case, the torsional springs 150a and 150c function as a torsional hinge having a rotation axis E that is parallel to the x-axis.

Figure 10B:
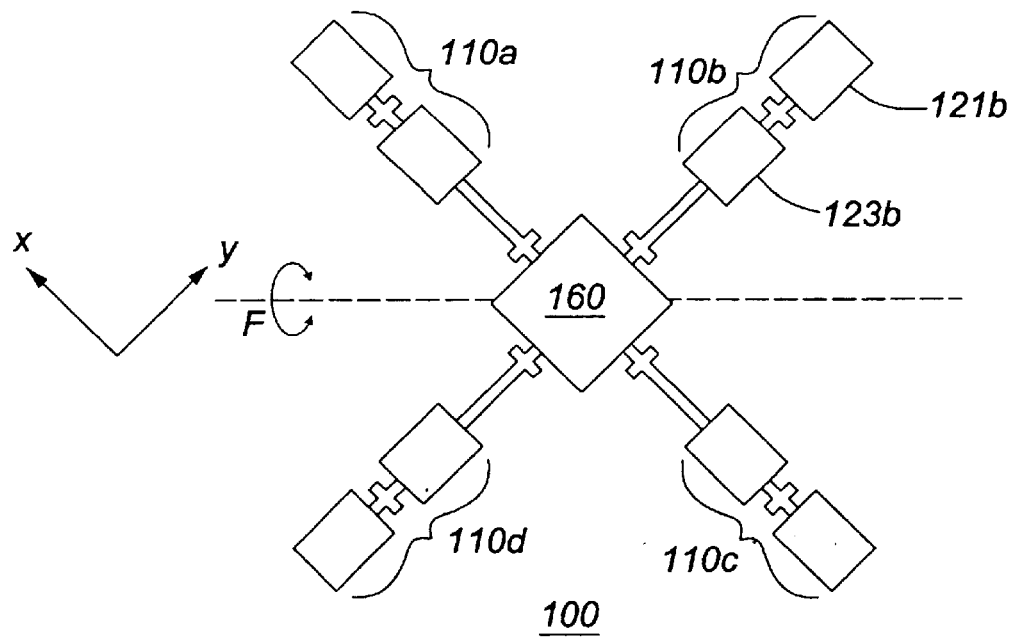
FIG. 10b is a schematic diagram of the 2D element depicted in FIG. 10a, showing an alternate mode of operation.

Referring to FIG. 10b, a different method of actuating the articulated element shown in FIG. 10a is shown. In particular, electrostatic actuation about rotation axis F is initiated by simultaneously applying a voltage between the upper and lower electrodes of the outer portions of electrostatic actuators 110a and 110b and between the upper and lower electrodes of the inner portions of electrostatic actuators 110c and 110d. Of course, the device illustrated in FIGS. 10a and 10b do not limit rotation to a fixed axis (e.g., D, E, and/or F), but in fact provides free rotation of the central mirror by varying the voltage applied to one or more actuators 110a–d. In other words, by applying two different voltages to two different actuators, the mirror is able to rotate about axes that are intermediate between E and F.

Figure 11:
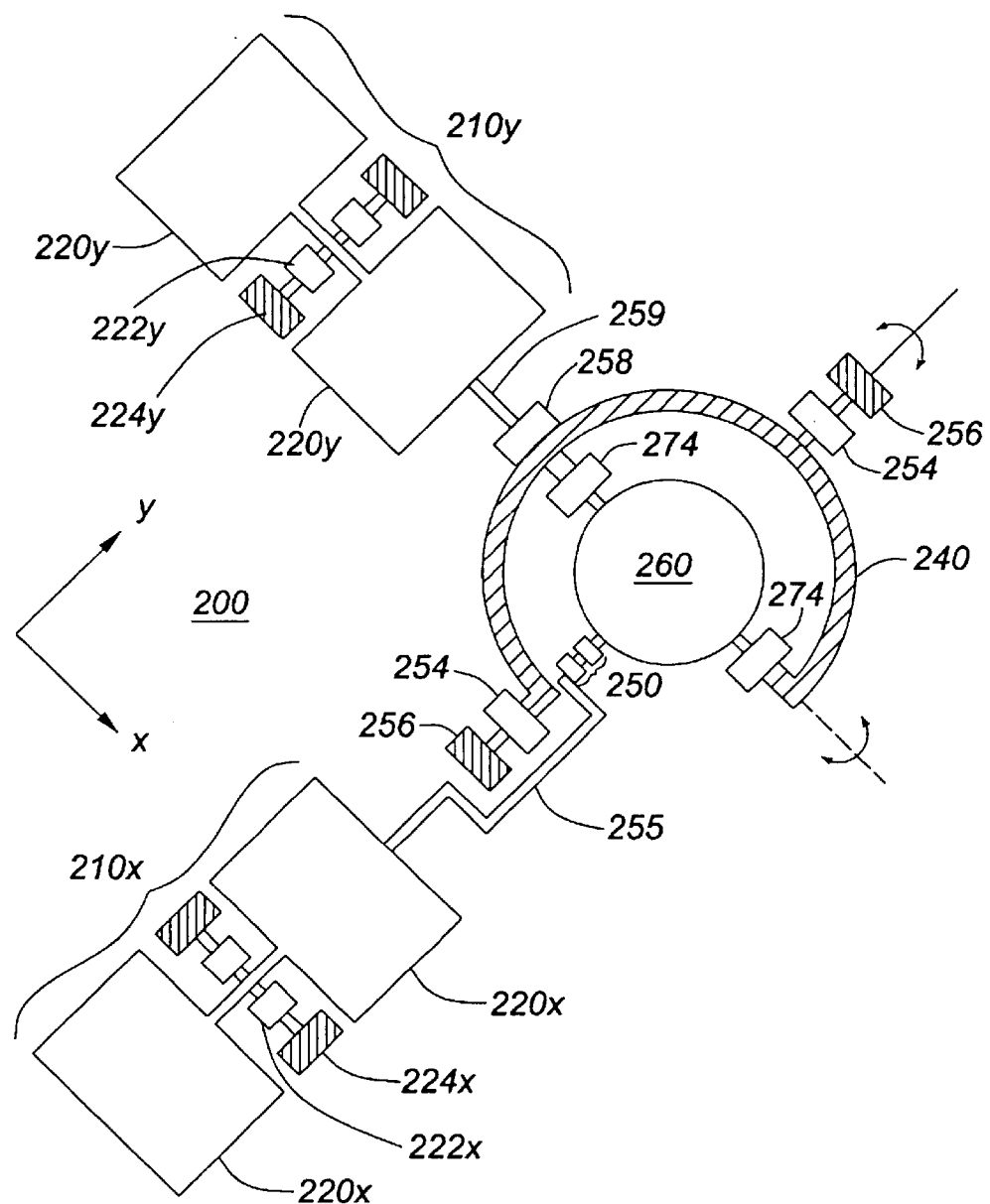
FIG. 11 is a schematic diagram of a 2D element of a MEMS device in accordance with another embodiment of the instant invention.

Referring to FIG. 11 there is shown another embodiment of an articulated MEMS element rotatable about two axes. The articulated MEMS element 200 includes electrostatic rotatory actuator 210x, electrostatic rotatory actuator 210y, a gimbal ring 240, and a micro-mirror 260.

The first actuator 210x is coupled to the mirror 260 and drives the mirror 260 to rotate about an axis parallel to the x-axis. The first actuator 210x includes a plate 220x, a torsional hinge 222x, mechanical anchors 224x, an upper electrode (not shown) disposed on the plate 220x and two lower electrodes (not shown) disposed on the substrate (not shown). The torsional hinge 222x has a first end coupled to a first side of the plate 220x and a second end coupled to a second opposing side of the plate 220x. Each end of the torsional hinge 222x is supported by one of the mechanical anchors 224x, such that the plate 220x is suspended above the substrate (not shown) and is able to tilt, rotate, and/or pivot about a rotation axis parallel to the x-axis. Movement of the plate 220x about the rotation axis is actuated electrostatically. In particular, a voltage is applied between the lower electrode and the upper electrode of either the inner or outer portion of the actuator 210x.

As the electrostatic actuator 210x is driven, the torsional coupling hinge 250 and coupling bar 255 force the mirror 260 to rotate about a rotation axis co-axial with mirror hinge 274 (i.e., parallel to the x direction), which couples the mirror 260 to the gimbal ring 240. In particular, when a voltage is applied between the electrodes of the outer portion of the actuator 210x, then the end of the mirror coupled to the actuator 210x is deflected up, whereas when the voltage is applied between the electrodes of the inner portion of the actuator 210x, then the end of the mirror coupled to the actuator 210x is driven down towards the substrate (not shown).

The second actuator 210y is coupled to the gimbal ring 240. The second actuator 210y includes a plate 220y, a torsional hinge 222y, mechanical anchors 224y, an upper electrode (not shown) disposed on the plate 220y, and two lower electrodes (not shown) disposed on the substrate (not shown). The torsional hinge 222y has a first end coupled to a first side of the plate 220y and a second end coupled to a second opposing side of the plate 220y. Each end of the torsional hinge 222y is supported by one of the mechanical anchors 224y, such that the such that the plate 220y is suspended above the substrate (not shown) and is able to tilt, rotate, and/or pivot about a rotation axis parallel to the y-axis. Movement of the plate 220y about the rotation axis is actuated electrostatically. In particular, a voltage is applied across the lower electrode and the upper electrode of either the inner or outer portion of the actuator 210y.

As the electrostatic actuator 210y is driven, the torsional coupling hinge 258 and coupling bar 259 force the gimbal 240, and hence the mirror 260, to rotate about a rotation axis co-axial with gimbal ring hinge 254 (i.e., parallel to the y direction), which is supported by mechanical anchors 256. In particular, when a voltage is applied between the electrodes of the outer portion of the actuator 210y, then the end of the gimbal and mirror closest to the actuator 210y is deflected up, whereas when the voltage is applied between the electrodes of the inner portion of the actuator 210y, then the end of the gimbal and mirror closest to the actuator 210y is driven down towards the substrate (not shown).

Figure 12A:
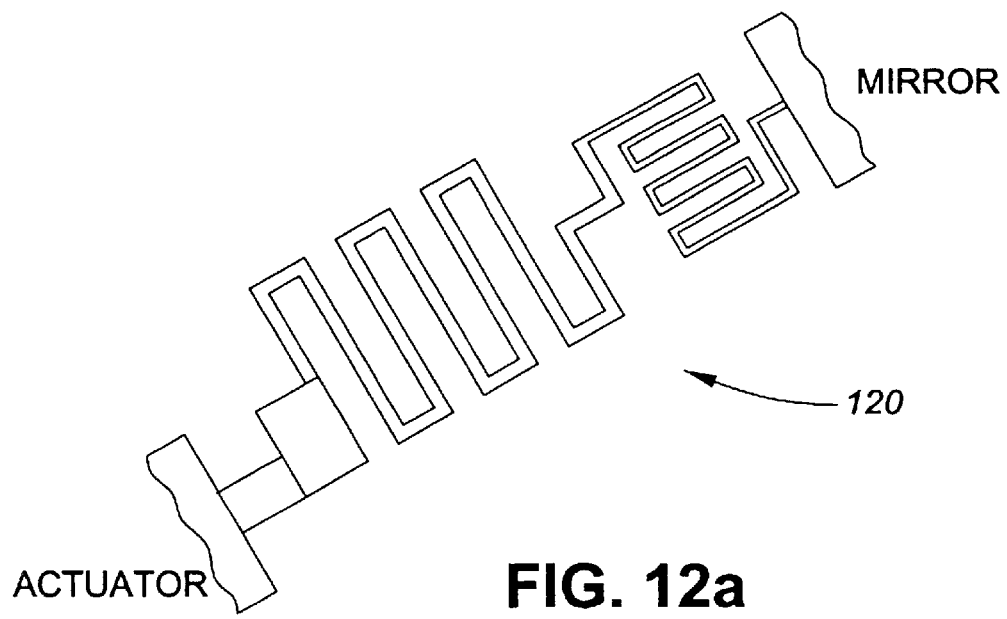
FIG. 12a is a schematic diagram of a universal coupling hinge.
Figure 12B:
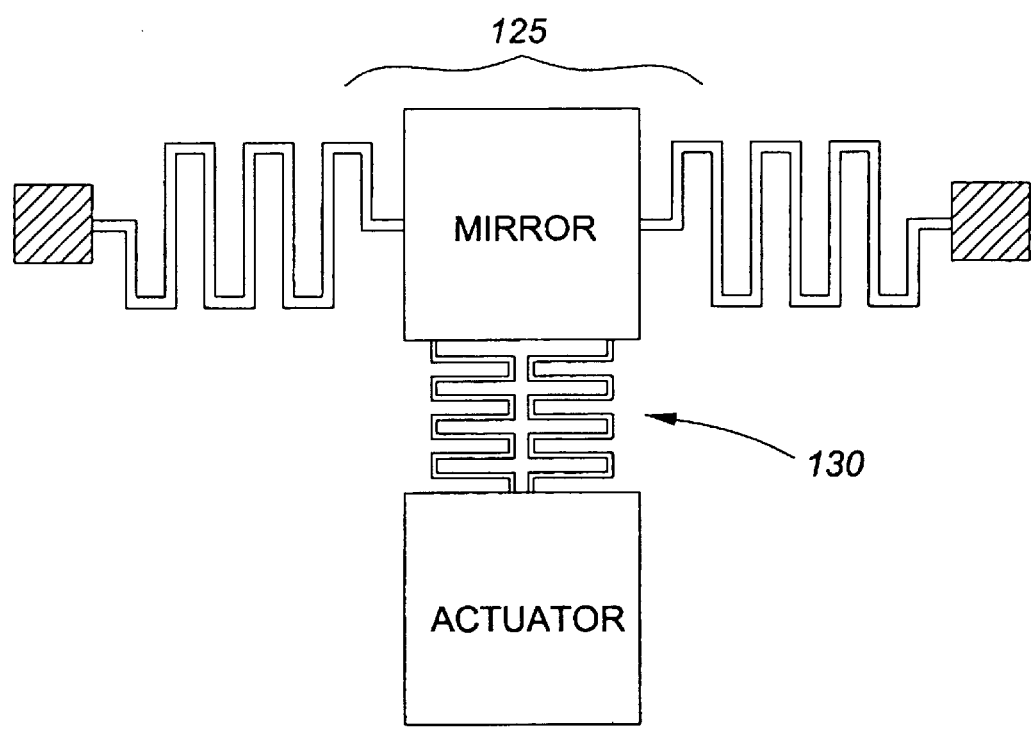
FIG. 12b is a schematic diagram of a torsional coupling hinge.

Notably, this arrangement is possible because torsional coupling hinge 250 has a first component that allows rotation about an axis parallel to the x-direction and a second component that allows rotation about an axis parallel to the y-direction, and also provides longitudinal extension (i.e., torsional coupling hinge 250 is a universal coupler). FIG. 12a illustrates one embodiment of a universal coupling hinge 120 as discussed above with respect to FIGS. 10 and 11, whereas FIG. 12b illustrates embodiments of a uni-direction torsional hinge 125 and a unidirectional torsional coupling hinge 130 that are suitable for use in the elements shown in FIGS. 3, 6, 7, 8, and 9. In particular, uni-directional torsional hinge 125 would be suitable for elements 322, 622, 674, 722, 774, 822, and 922a–d, while uni-directional torsional coupling hinge 130 would be suitable for elements 350, 374, 650, 750, 850, 874, and 950a–d. It is also possible for the unidirectional torsional coupling hinge 130 to be constructed from a single flexure. In either instance, the uni-direction torsional hinges 130 are also able to extend and/or stretch to accommodate the gaps between the mirror plate and actuator plate as they are rotated. Advantageously, the above torsional hinges are resilient. Preferably, each of the hinges (or torsional joints) is lithographically defined, as is well known in the art.

Advantageously, the 2D element depicted in FIG. 11 is more compact and functions more efficiently than the 2D element depicted in FIG. 10. Moreover, the design of the element depicted in FIG. 11 eliminates the number of electrostatic actuators needed.

The articulated MEMS elements/devices described heretofore are manufacturable using methods known in the art. For example, the articulated MEMS devices can be fabricated using a silicon-on-insulator (SOI) structure, wherein a silicon substrate has deposited thereon a sacrificial insulating silicon dioxide layer, followed by another silicon layer. The upper silicon layer and silicon dioxide layer are patterned to form the articulated structure. Subsequently, portions of the sacrificial layer are removed to release the articulated structure. The step of patterning a layer includes a sequence of well known processing steps, which for example, may include applying a photoresist to the layer, pre-baking the photoresist, aligning the layer with a photomask, exposing the photoresist through the photomask, developing the photoresist, baking the wafer, etching away the surfaces not protected by the photo resist, and/or stripping the protected areas of the photoresist. In another embodiment, the articulated MEMS elements/devices are fabricated using a method similar to that detailed in U.S. Pat. No. 6,480,320, hereby incorporated by reference.

For example, in a preferred embodiment, a SOI wafer (the electrode wafer) is oxidized and polysilicon is deposited and patterned to define the electrodes and appropriate circuitry. Preferably, the electrode wafer is etched to provide mechanical clearance for the mirrors and/or actuators. A second SOI wafer (the mirror wafer) is etched to form the trenches that the mirrors and actuators will rotate within. In particular, the trenches are etched in positions mirroring the position of the electrodes on the electrode wafer and the positions of the mirror plates. The electrode and mirror wafers are then bonded together with proper alignment of the trenches to the electrodes and mirror clearances, using any known bonding methods. Excess bulk of the mirror wafer is then removed such that there is a single layer of silicon left within the mirror wafer that can be patterned to form the mirror plates, the actuator plates, and the torsional hinges. Blanket metalization provides the reflective surface on the mirror plate and actuator plate, the latter of which serves as the upper electrode.

In an alternate embodiment, a lower silicon layer of the mirror SOI wafer is designed and/or polished with a predetermined thickness that is selected in accordance with the desired air-gap spacing (i.e., the silicon oxide layer serves as an etch stop). In this embodiment, the bulk of the mirror wafer is not removed, but instead an upper silicon layer is polished to a desired mirror/actuator thickness and the silicon oxide and upper polished silicon layer are patterned to form the mirror plates, the actuator plates, and the torsional hinges. The mirror layer is patterned before or after bonding the two wafers. An example, of the former is disclosed in U.S. Pat. No. 6,201,631, hereby incorporated by reference. These latter two embodiments provide a very precise and accurate air-gap spacing for all mirrors within the micro-mechanical structure.

Of course, numerous other embodiments may be envisaged, without departing from the spirit and scope of the invention.

What is claimed is:

1. A micro-electro-mechanical device comprising:
   a substrate;
   a mirror supported above the substrate, the mirror including a first plate having a reflective coating deposited thereon and configured to tilt about a first rotation axis; and
   an actuator for controlling a tilt of the first plate, the actuator including a second other plate supported above the substrate, the second plate configured to tilt about a second other rotation axis, the first and second plates being mechanically coupled via a torsional coupling hinge.

2. A micro-electro-mechanical device according to claim 1, wherein the first plate, the second plate, and the torsional coupling hinge are all fabricated from a same layer during a micro-machining fabrication process.

3. A micro-electromechanical device according to claim 1, wherein the actuator comprises an electrostatic actuator.

4. A micro-electro-mechanical device according to claim 1, wherein the first and second plates are suspended above the substrate via torsional hinges.

5. A micro-electro-mechanical device according to claim 4, wherein the torsional hinges comprise a first torsional hinge co-axial with the first axis and a second torsional hinge co-axial with the second axis.

6. A micro-electro-mechanical device according to claim 5, comprising an anchor disposed on the substrate and coupled to the first plate via the first torsional hinge.

7. A micro-electro-mechanical device according to claim 4, wherein the torsional hinges comprise a mirror torsional hinge having a rotation axis at approximately 45 degrees to the first axis.

8. A micro-electro-mechanical device according to claim 1, wherein the first and second axes bisect a length of the first and second plates, respectively.

9. A micro-electro-mechanical device according to claim 1, wherein the first axis bisects a length of the first plate and the second axis is disposed at an end of the second plate.

10. A micro-electro-mechanical device according to claim 1, wherein the first axis is disposed at an end of the first plate and the second axis bisects a length of the second plate.

11. A micro-electro-mechanical device according to claim 1, wherein the first axis is disposed at an end of the first plate and the second axis is disposed at an end of the second plate.

12. A micro-electro-mechanical device according to claim 1, comprising first and second lower electrodes disposed on the substrate below the second plate for tilting the second plate about the second axis.

13. A micro-electro-mechanical device according to claim 12, comprising an upper electrode deposited on the second plate.

14. A micro-electro-mechanical device according to claim 13, wherein at least one of the second plate and the upper electrode comprises a hollow section.

15. A micro-electro-mechanical device according to claim 1, comprising a single lower electrode disposed on the substrate below the second plate for tilting the second plate about the second axis.

16. A micro-electro-mechanical device according to claim 1, wherein a distance from the first axis to an end of the first plate is smaller than a distance from the second axis to an end of the second plate.

17. A micro-electro-mechanical device according to claim 1, wherein the actuator comprises a third plate coupled to the first plate opposite the second plate via another torsional coupling hinge, the third plate supported above the substrate and configured to tilt about a third other rotation axis.

18. A micro-electro-mechanical device according to claim 17, comprising a fulcrum coupled to the substrate and coincident with the first rotation axis.

19. A micro-electro-mechanical device according to claim 1, including addressing circuitry coupled to the substrate to selectively apply power to the actuator.

20. A micro-electro-mechanical device according to claim 1, comprising a plurality of other mirrors supported above the substrate in a linear array, each other mirror including a mirror plate having a reflective coating deposited thereon and configured to tilt about a mirror rotation axis.

21. A micro-electro-mechanical device according to claim 20, wherein each mirror rotation axis is a same fixed rotation axis parallel to the longitudinal axis of the array.

22. A micro-electro-mechanical device according to claim 20, wherein each mirror rotation axis coincides with one of two fixed, parallel, spaced apart rotation axes that are parallel to the longitudinal axis of the array.

23. A micro-electro-mechanical device according to claim 22, comprising a plurality of actuators for moving the plurality of other mirrors, each actuator including an actuator plate supported above the substrate and configured to tilt about an actuator rotation axis, the mirror plates and actuator plates mechanically.

24. A micro-electro-mechanical device according to claim 23, wherein the actuators for adjacent mirrors are staggered on opposite sides of a central region defined by the two fixed, parallel, spaced apart rotation axes.

25. A micro-electro-mechanical device according to claim 1, wherein the device is a piano MEMS having a staggered actuator arrangement.

26. A micro-electro-mechanical device according to claim 1, wherein the mirror is supported by a gimbal via a mirror torsional hinge.

27. A micro-electro-mechanical device according to claim 26, wherein the torsional coupling hinge coupling the first and second plates is a universal coupler.

28. A micro-electro-mechanical device according to claim 27, comprising a second actuator for controlling a tilt of the gimbal, the second actuator including a third plate supported above the substrate, the third plate configured to tilt about a rotation axis perpendicular to the first axis, the gimbal and the third plate being mechanically coupled via a second torsional coupling hinge.

29. A micro-electro-mechanical device according to claim 28, wherein the gimbal is supported above the substrate by a gimbal torsional hinge.

30. A micro-electro-mechanical device according to claim 1, wherein the torsional coupling hinge is a universal coupler.

31. A micro-electro-mechanical device according to claim 30, comprising a second, third and fourth actuator for controlling a tilt of the first mirror, each actuator coupled to the first plate with a separate torsional coupling hinge.

32. A micro-electro-mechanical device according to claim 31, wherein each actuator comprises an electrostatic, rotatory, actuator.

33. A micro-electro-mechanical device according to claim 32, wherein the mirror is freely rotatable.

34. A micro-electro-mechanical device according to claim 1, wherein the torsional coupling hinge is resilient.

35. A micro-electro-mechanical device comprising:
   a substrate;
   a linear array of mirrors suspended above the substrate, each mirror including a mirror plate with a reflective surface deposited thereon, each mirror plate movable about a fixed rotation axis; and
   an actuator for controlling the movement of each mirror, each actuator including an actuator plate suspended above the substrate, the actuator plate configured to move about another fixed rotation axis,
   wherein each mirror plate is mechanically coupled to an actuator plate via a torsional spring.

36. A micro-electromechanical device according to claim 35, wherein the actuators have a staggered arrangement with respect to a central longitudinal axis of the linear array.

37. A micro-electro-mechanical device fabricated from a micro-machining process, the device comprising:
   a micro-electronic substrate;
   a mirror including a first plate having a reflective surface deposited thereon flexibly suspended over the micro-electronic substrate; and
   an actuator including a second plate flexibly suspended over the micro-electronic substrate and coupled to the first plate via a flexible joint,
   wherein the first plate, the flexible joint, and the second plate are fabricated from a same layer during the micro-machining process.

* * * * *